(12) United States Patent
Abdelhalim et al.

(10) Patent No.: US 10,187,230 B1
(45) Date of Patent: Jan. 22, 2019

(54) EQUALIZATION FOR TRANSMITTER INPUT BUFFER ARRAY

(71) Applicant: INPHI CORPORATION, Santa Clara, CA (US)

(72) Inventors: Karim Abdelhalim, Newport Coast, CA (US); Michael Le, Laguna Niguel, CA (US); Haidang Lin, Sunnyvale, CA (US)

(73) Assignee: INPHI CORPORATION, Santa Clara, CA (US)

( * ) Notice: Subject to any disclaimer, the term of this patent is extended or adjusted under 35 U.S.C. 154(b) by 0 days.

(21) Appl. No.: 15/699,882

(22) Filed: Sep. 8, 2017

(51) Int. Cl.
  *H04L 25/03* (2006.01)
  *H03K 19/00* (2006.01)
(52) U.S. Cl.
  CPC ..... *H04L 25/0328* (2013.01); *H03K 19/0008* (2013.01); *H04L 2025/03541* (2013.01); *H04L 2025/03777* (2013.01)

(58) Field of Classification Search
  CPC .......................... H04L 25/0282; H03K 21/406
  See application file for complete search history.

(56) References Cited

U.S. PATENT DOCUMENTS 3,950,607 A * 4/1976 Southworth ............. H04B 1/66
178/24

* cited by examiner

*Primary Examiner* — Kabir A Timory
(74) *Attorney, Agent, or Firm* — Richard T. Ogawa; Ogawa P.C.

(57) ABSTRACT

The present invention relates to data communication techniques and integrated circuit devices. More specifically, embodiments of the present invention provide an input buffer module that utilizes one or more equalization elements. The input buffer module includes an array of inverters arranged in a series. An equalization element is configured in series relative to a segment of the array of inverters. The resistance value of the equalization element is predetermined based on a delay associated with the segment of the array of inverters. There are other embodiments as well.

20 Claims, 15 Drawing Sheets

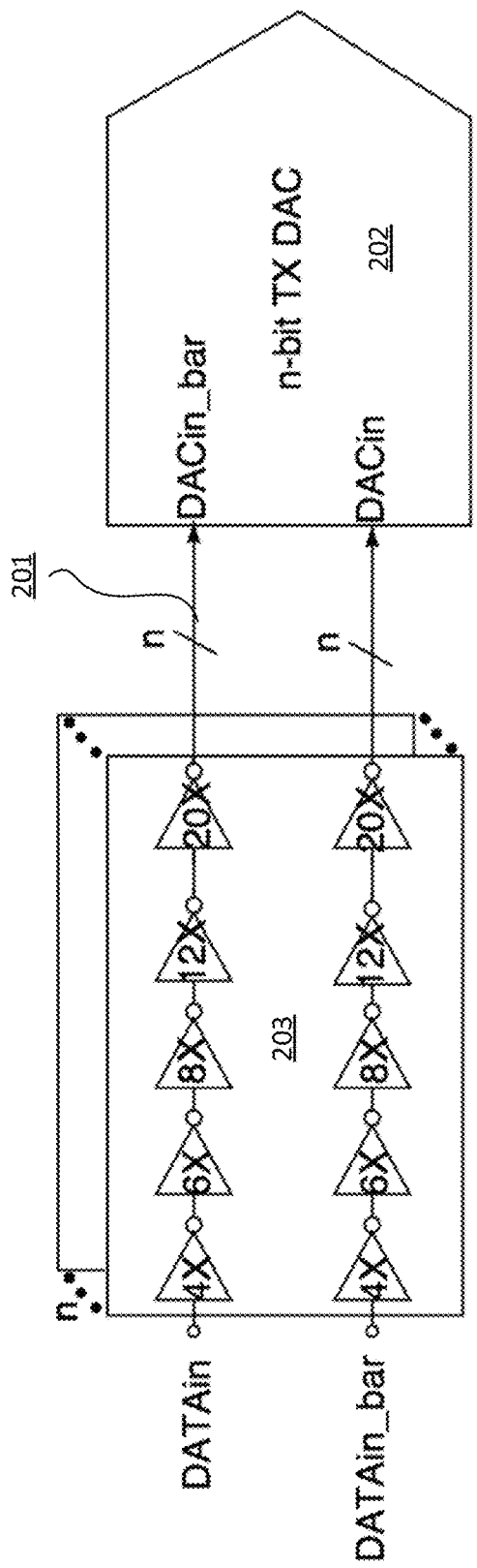
Figure 2
(Conventional)

EQUALIZATION FOR TRANSMITTER INPUT BUFFER ARRAY

CROSS-REFERENCES TO RELATED APPLICATIONS

NOT APPLICABLE

STATEMENT AS TO RIGHTS TO INVENTIONS MADE UNDER FEDERALLY SPONSORED RESEARCH AND DEVELOPMENT

NOT APPLICABLE

REFERENCE TO A "SEQUENCE LISTING," A TABLE, OR A COMPUTER PROGRAM LISTING APPENDIX SUBMITTED ON A COMPACT DISK

NOT APPLICABLE

BACKGROUND OF THE INVENTION

The present invention relates to data communication techniques and integrated circuit (IC) devices.

Over the last few decades, the use of communication networks has exploded. In the early days of the Internet, popular applications were limited to emails, bulletin board, and mostly informational and text-based web page surfing, and the amount of data transferred was relatively small. Today, the Internet and mobile applications demand a huge amount of bandwidth for transferring photo, video, music, and other multimedia files. For example, a social network like Facebook processes on the order of petabytes of data daily. With such high demands on data storage and data transfer, existing data communication systems need to be improved to address these needs.

In high speed data communication, input buffers are often implemented in conjunction with data transmitters and digital-to-analog converters (DACs). For example, an input buffer may include an array of inverters to reduce power dissipation and improve system performance. Over the past, there have been various techniques to implement input buffer modules. Unfortunately, they have been inadequate. Therefore, improved communication systems and methods are desired.

BRIEF SUMMARY OF THE INVENTION

The present invention relates to data communication techniques and integrated circuit devices. More specifically, embodiments of the present invention provide an input buffer module that utilizes one or more equalization elements. The input buffer module includes an array of inverters arranged in a series with an increasing drive strength with a fan-out typically between 1.5 and 4. An equalization element is configured in series relative to a segment of the array of inverters. The resistance value of the equalization element is predetermined based on a delay associated with the segment of the array of inverters. There are other embodiments as well.

According to an embodiment, the present invention provides a data input buffer device, which includes a first input terminal. The device also includes a first plurality of inverters comprising n inverters configured in series, where n is two or greater. The first plurality of inverters includes a first inverter and a first group of m inverters. The first inverter is coupled to the first input terminal. The device also includes a first equalization element that is characterized by a predetermined resistance value. The predetermined resistance value is based on a delay associated with the first group of m inverters. The first equalization element is configured in series relative to the first group of m inverters. The device additionally includes a first output terminal coupled to the first plurality of inverters. The device further includes a second input terminal. The device additionally includes a second plurality of inverters. The device also includes a second output terminal coupled to the second plurality of inverters. The device also includes a second equalization element coupled to the second plurality of inverters.

According to another embodiment, the present invention provides a digital-to-analog converter (DAC) system, which includes a DAC device being configured to convert n bits of input data. The system also includes a first input buffer module comprising a first plurality of inverters and a first equalization element. The first input buffer module is configured to provide a first input signal to the DAC device. The system further includes a second input buffer module comprising a second plurality of inverters and a second equalization element. The second input buffer module is configured to provide a second input signal to the DAC device. The first input signal and the second input signal form a pair of differential inputs signals. The first plurality of inverters includes a first a segment of m inverters. The first segment of m inverters is associated with a first delay value. The first equalization element is characterized by a first predetermined resistance value. The first predetermined resistance value is determined based on the first delay value.

According to yet another embodiment, the present invention provides a data input buffer device, which includes a first input terminal and a first plurality of inverters comprising n inverters configured in series, where n is two or greater. The first plurality of inverters includes a first inverter and a first group of m inverters. The first inverter is coupled to the first input terminal. The device also includes a first output terminal coupled to the first plurality of inverters. The device further includes a second input terminal. The device additionally includes a second plurality of inverters comprising n inverters configured in series. The second plurality of inverters includes a second inverter and a second group of m inverters. The second inverter is coupled to the second input terminal. The device additionally includes a first equalization element that is characterized by a first predetermined resistance value. The first predetermined resistance value is based on a delay associated with the second group of m inverters. The first equalization element is configured in series relative to the second group of m inverters. The device additionally includes a second equalization element that characterized by a second predetermined resistance value, which is based on a delay associated with the first group of m inverters. The second equalization element is configured in series relative to the first group of m inverters. The device also includes a second output terminal coupled to the second plurality of inverters.

It is to be appreciated that embodiments of the present invention provide many advantages over conventional techniques. Among other things, equalization elements according to embodiments of the present invention lower power consumption and effectively reduce undesirable inter-symbol interference (ISI) which severely degrades the SNR, thereby effectively improving performance of communication devices and data processing devices. It is also to be finite impulse response (FIR) and/or infinite impulse response (IIR) filters cannot equalize ISI associated with input buffer modules, and thus the equalization techniques according to embodiments of the present invention are uniquely effective.

Embodiments of the present invention can be implemented in conjunction with existing systems and processes. For example, equalization elements utilized in input buffer modules can be readily manufactured using existing processes. For relatively larger devices (e.g., manufactured using 20 nm or larger processes), CMOS based resistors can be used to provide resistance needed for equalization elements. For smaller devices (e.g., devices manufactured using 7 nm or 14 nm processes), small inverter devices (ex., 1X inverters) can be configured with opposite polarity to provide the resistance needed for equalization. Equalization elements additionally may be used in conjunction with electrical switches (e.g., transmission gates) to reduced unnecessary power consumption. It is also to be appreciated that equalization elements can flexibility be configured in many ways.

The present invention achieves these benefits and others in the context of known technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 2 is a simplified diagram illustrating a conventional input buffer module.

DETAILED DESCRIPTION OF THE INVENTION

The present invention relates to data communication techniques and integrated circuit devices. More specifically, embodiments of the present invention provide an input buffer module that utilizes one or more equalization elements. The input buffer module includes an array of inverters arranged in a series. An equalization element is configured in series relative to a segment of the array of inverters. The resistance value of the equalization element is predetermined based on a delay associated with the segment of the array of inverters. There are other embodiments as well.

Figure 1:
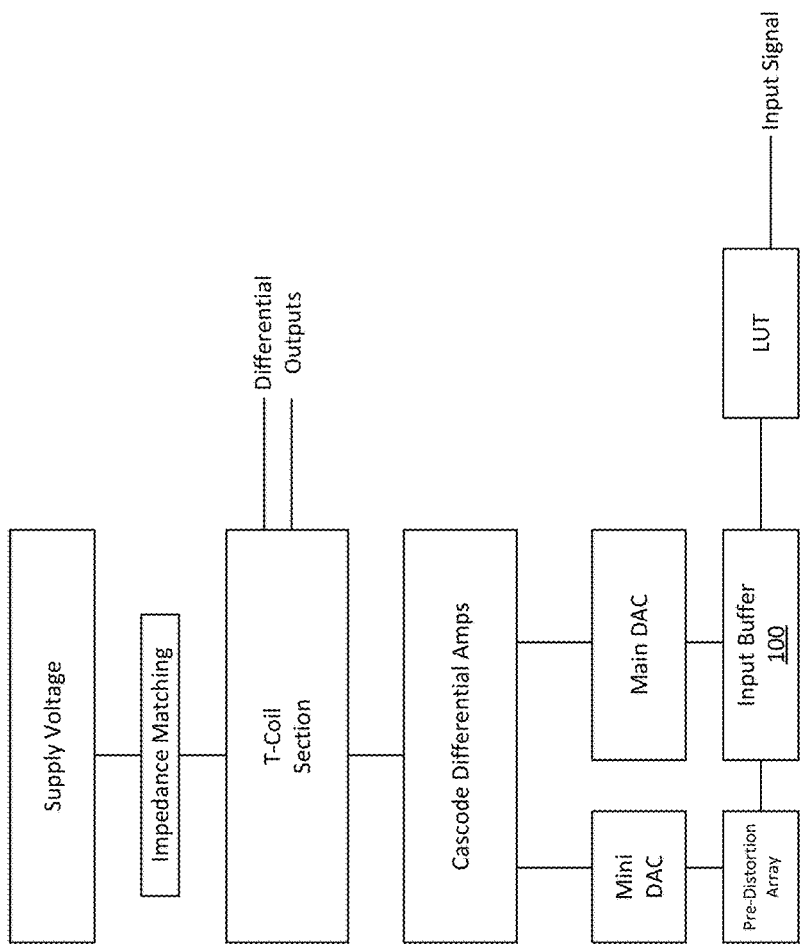
FIG. 1 is a simplified block diagram illustrating a communication device according to embodiments of the present invention.

As mentioned above, input buffer modules are often used in communication device to receive input signals. For example, transmission (TX) input buffer modules are implemented in various types of data transmission devices. FIG. 1 is a simplified block diagram illustrating a communication device according to embodiments of the present invention. This diagram is merely an example, which should not unduly limit the scope of the claims. One of ordinary skill in the art would recognize many variations, alternatives, and modifications. For example, input signals pass through input buffer module 100 before being processed by the main DAC as shown. Being on the data path of the input signal, input buffer module 100 inevitably affect signal quality.

Figure 3:
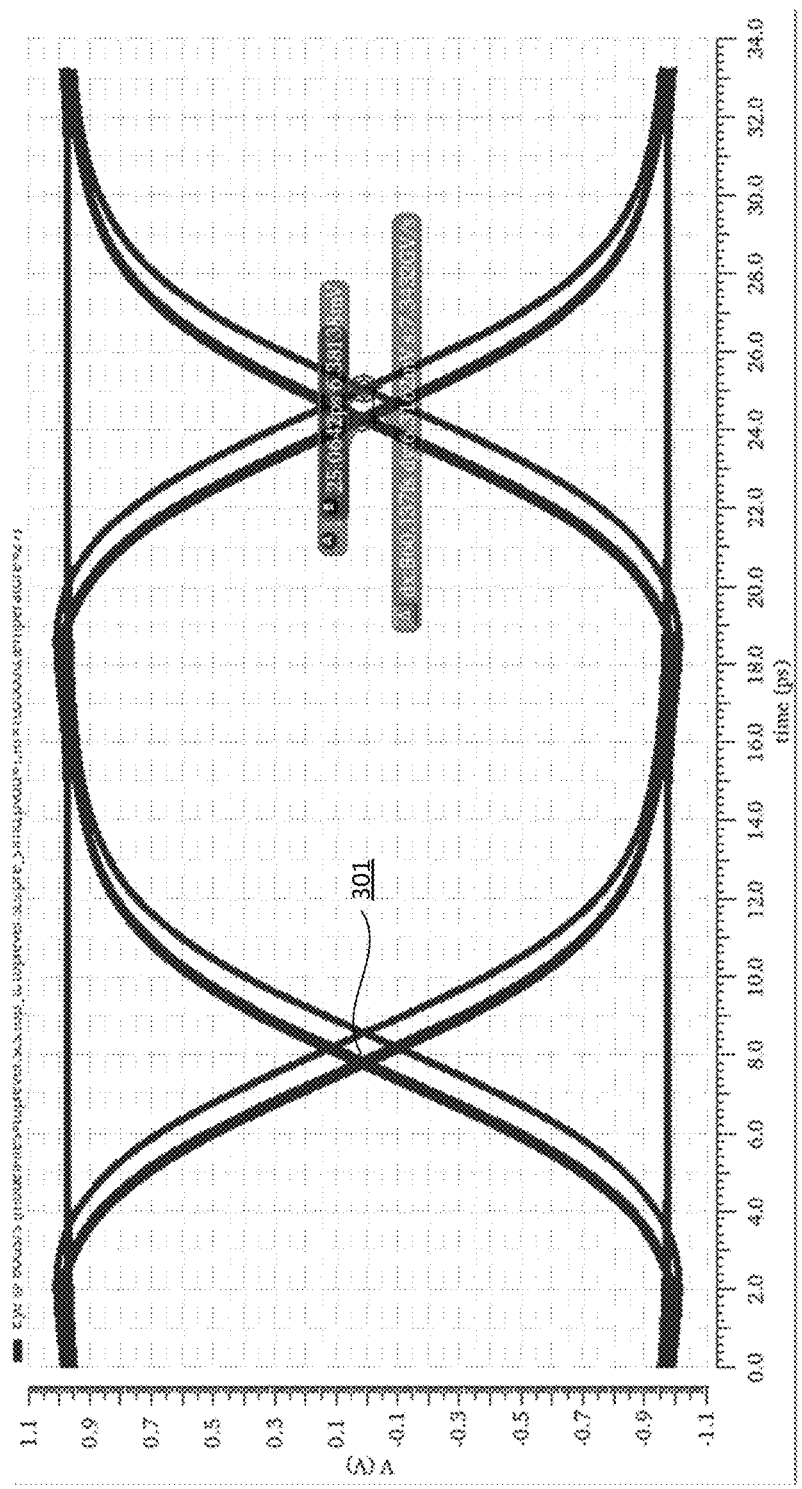
FIG. 3 is a graph illustrating ISI associated with conventional input buffer module.

FIG. 2 is a simplified diagram illustrating a conventional input data input buffer module. Data are received at input terminals DATAin and DATAin_bar by data input buffer module 203. A set of five inverters (4X, 6X, 8X, 12X, and 20X) are configured as an input buffer array for DATAin, and through the input buffer array, data are provided to the DAC 202 for processing. A similarly arranged set of five inverters are configured as an input buffer array for DATAin_bar. For example, DATAin and DATAin_bar are a pair of differential input signals. DAC 202 may receive n bits of input data from n slices of input buffer modules, each processing a pair of data bits. For example, inverters of the input data input buffer module 203 are implemented using CMOS inverters. Data input buffer module 203 can be used to drive transmitter (TX) DACs or transmitters. For high-speed data communication applications, a large number of inverters may be needed to save power dissipation. At high-speed operation (e.g., greater than 28 GHz), CMOS based inverters often exhibit bandwidth limitations that lead to undesirable inter-symbol interference (ISI). For example, ISI is often present at node 201 in FIG. 2, and can degrade SNDR performance of the DAC, especially when operating in high frequency. FIG. 3 is a graph illustrating ISI associated with conventional data input buffer module. For example, after adding PRBS7 data and plotting eye diagram, effect of ISI can be shown at region 301. To minimize ISI, large inverters with relatively high-power consumption are often needed. It is to be appreciated that embodiments of the present invention provide equalization for minimizing ISI without needing large inverters. It is to be noted that while large inverters can reduce the amount of undesirable ISI, they cannot eliminate ISI, and they dissipate additional power. It is thus to be appreciated equalization techniques according to embodiments of the present invention can eliminate ISI without increasing the amount of power dissipation.

The following description is presented to enable one of ordinary skill in the art to make and use the invention and to incorporate it in the context of particular applications. Various modifications, as well as a variety of uses in different applications will be readily apparent to those skilled in the art, and the general principles defined herein may be applied to a wide range of embodiments. Thus, the present invention is not intended to be limited to the embodiments presented, but is to be accorded the widest scope consistent with the principles and novel features disclosed herein.

In the following detailed description, numerous specific details are set forth in order to provide a more thorough understanding of the present invention. However, it will be apparent to one skilled in the art that the present invention may be practiced without necessarily being limited to these specific details. In other instances, well-known structures and devices are shown in block diagram form, rather than in detail, in order to avoid obscuring the present invention.

The reader's attention is directed to all papers and documents which are filed concurrently with this specification and which are open to public inspection with this specification, and the contents of all such papers and documents are incorporated herein by reference. All the features disclosed in this specification, (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Furthermore, any element in a claim that does not explicitly state "means for" performing a specified function, or "step for" performing a specific function, is not to be interpreted as a "means" or "step" clause as specified in 35 U.S.C. Section 112, Paragraph 6. In particular, the use of "step of" or "act of" in the Claims herein is not intended to invoke the provisions of 35 U.S.C. 112, Paragraph 6.

Please note, if used, the labels left, right, front, back, top, bottom, forward, reverse, clockwise and counter clockwise have been used for convenience purposes only and are not intended to imply any particular fixed direction. Instead, they are used to reflect relative locations and/or directions between various portions of an object.

Figure 4:
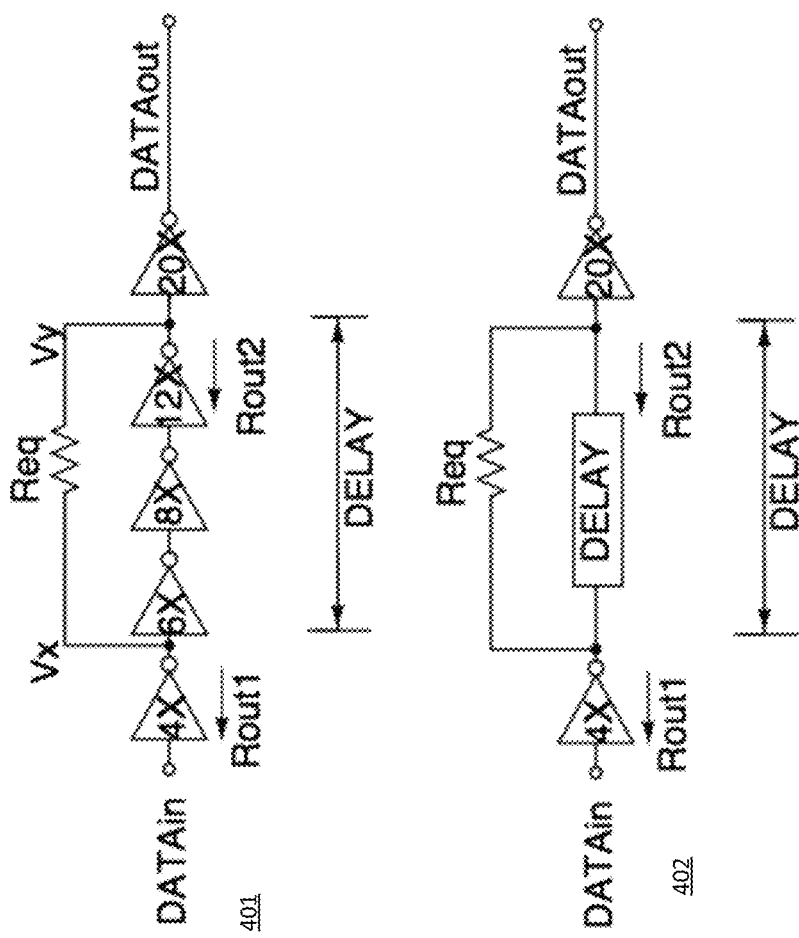
FIG. 4 is a simplified diagram illustrating input buffers according to embodiments of the present invention.

FIG. 4 is a simplified diagram illustrating data input buffer modules according to embodiments of the present invention. This diagram is merely an example, which should not unduly limit the scope of the claims. One of ordinary skill in the art would recognize many variations, alternatives, and modifications. Input buffer 401 is configured to receive data from an input terminal DATAin as shown. The received data propagate through an array of five inverters (i.e., 4X, 6X, 8X, 12X, and 20X) as shown. A resistor $R_{eq}$ is configured in parallel relative to an odd number of inverters and provides equalization. For example, resistor $R_{eq}$ is configured in parallel relative to inverters 6X, 8X, and 12X. Between nodes $V_x$ and $V_y$, the net effect of resistor $R_{eq}$ is to provide a voltage that is opposite of the input signal received at the input terminal DATAin. It is to be understood an odd number of inverters are configured in parallel relative to resistor $R_{eq}$ to provide a polarity change (ie.g, between $V_x$ and $V_y$) for negative cancellation signal that provides equalization. The value of resistor $R_{eq}$ determines the equalizer tap and the number of inverters determine the amount of delay. For example, to determine the amount of resistance needed for a desired level of equalization, the following equation is used:

$$Vy = \frac{Rout2}{Rout1 + Req + Rout2} DATAin - \frac{Rout1 + Req}{Rout1 + Req + Rout2} DATAin[1 - \text{DELAY}] \quad \text{Equation 1}$$

As can be seen in Equation 1, the amount of equalization depends on the size and strength of inverters. More specifically, Rout1 and Rout2 correspond to equivalent resistance values of inverters. As mentioned above, the resistance value of resistor $R_{eq}$ is specifically calibrated to cancel undesirable ISI in data communication. It is to be noted that ISI and consequently the resistance value of resistor $R_{eq}$ are also based on the sample rate.

The amount of delay is based on the number of inverters configured in parallel relative to equalization resistor $R_{eq}$. For example, input buffer 402 shows that inverters, configured in parallel to resistor $R_{eq}$ effective form, a delay module. As explained above, the delay module for input buffer 402 includes an odd number of inverters, which provides the needed polarity change. The delay is determined such that the combination of inverters and resistor $R_{eq}$ functions as a fractionally spaced equalizer, where the delay is less than 1-unit interval (UI). At low sample rates, the amount of delay attributed to the inverters is substantially negligible relative to data rate, and equalization could be unnecessary. However, at high sample rate (e.g., near 28 GHz data rate), both resistance value of $R_{eq}$ and the amount of delay associated with inverters needs to be carefully calculated and calibrated. For example, specific data transfer characteristics may be measured and used to determine the configuration (e.g., how many and which inverters to be used in equalization) and resistance value.

It is to be appreciated the input buffer modules illustrated in FIG. 4 can be used in various applications. For example, the output of input buffer 401 can be coupled to DAC, NRZ driver, and/or various types of transmitters. Depending on the implementation, input buffers 401 and 402 can be configured as differential pairs or single-ended.

Figure 5:
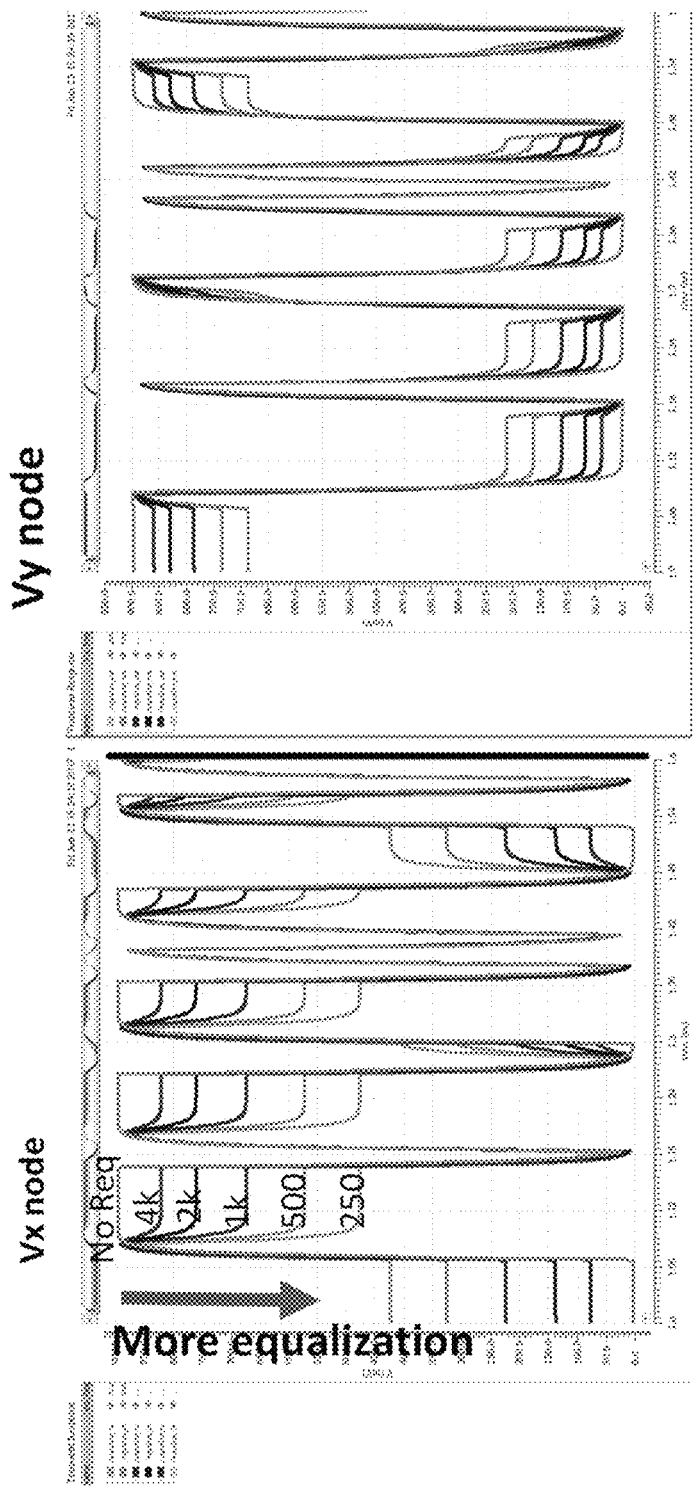
FIG. 5 provide graphs illustrating effect of resistor equalization for input buffer 401.

FIG. 5 provide graphs illustrating effect of resistor equalization for input buffer 401. This diagram is merely an example, which should not unduly limit the scope of the claims. One of ordinary skill in the art would recognize many variations, alternatives, and modifications. For given resistance values of inverters where Rout1=400 and Rout2=200, the equalization curves corresponding to resistance values for $R_{eq}$ at Vx node and Vy are shown side by side. More specifically, values of $R_{eq}$ are at infinity (i.e., open circuit or no $R_{eq}$), 4K, 2K, 1K, 500, and 250. As can be seen from FIG. 5, as the resistance value of resistor $R_{eq}$ decreases, the amount of equalization increases, both at Vx node and Vy node. It is to be appreciated that the optimal equalization value can be determined empirically and/or through calculation.

Figure 6:
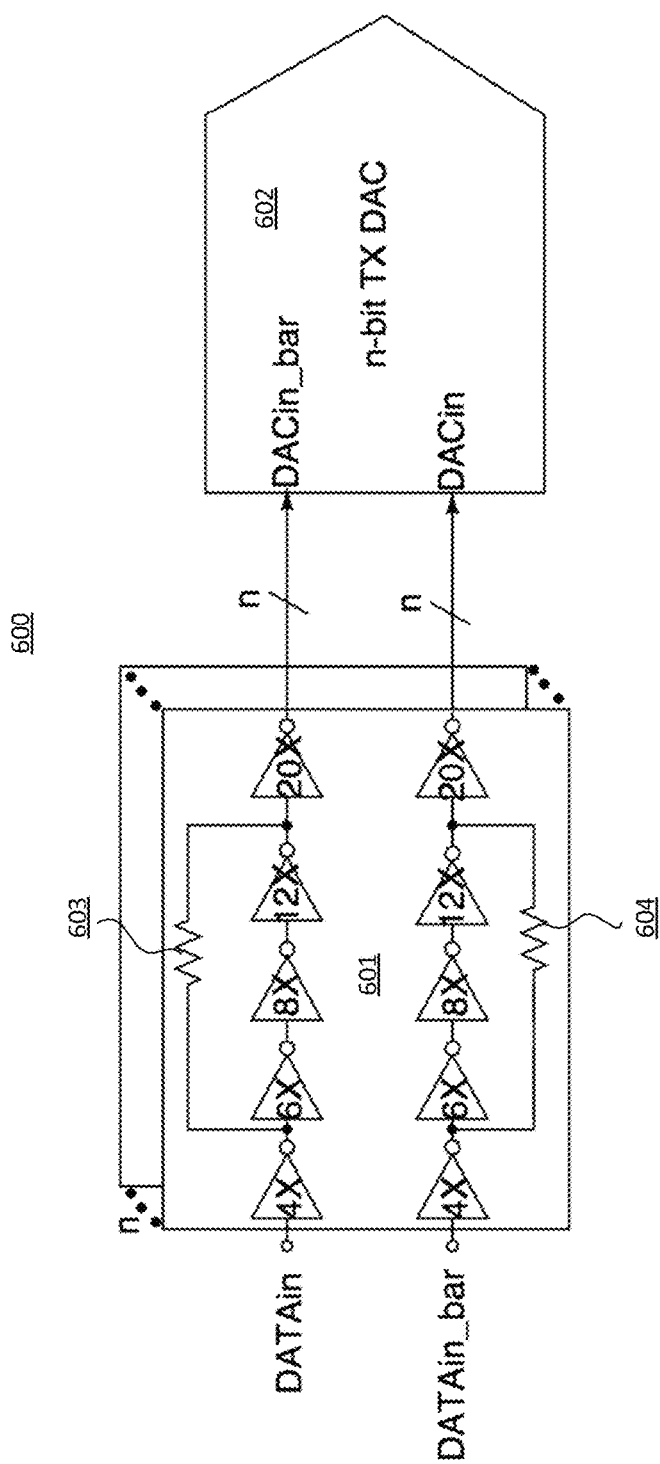
FIG. 6 is a simplified diagram illustrating an input buffer module implemented in conjunction with a DAC according to embodiments of the present invention.

FIG. 6 is a simplified diagram illustrating an input buffer module implemented in conjunction with a DAC according to embodiments of the present invention. This diagram is merely an example, which should not unduly limit the scope of the claims. One of ordinary skill in the art would recognize many variations, alternatives, and modifications. System 600 includes an n-bit DAC 602, which uses n slices of input buffer modules. For example, input buffer module 601 is one of the n input slices. It is to be appreciated that depending on the specific bits, the n slices may be configured differently. For example, least significant bits (LSB) may need fewer inverters than the most significant bits (MSB). For drive module 601, five inverters (4X, 6X, 8X, 12X, and 20X) are configured in series for DATAin input, and resistor 603 is configured in parallel relative to an odd (e.g., three in this specific implementation) number of inverters: 6X, 8X, and 12X. For example, resistor 603 is specifically configured to provide the equalization needed by the communication system, and the three inverters in parallel to resistor 603 provide delay. A separate set of five inverters are configured in series for DATAin_bar input, and resistor 604 is configured in parallel to inverters 6X, 8X, and 12X. As explained above, resistor 603 and resistor 604, configured with inverters, provide one-tap analog equalization to reduce and/or remove ISI.

Figure 7:
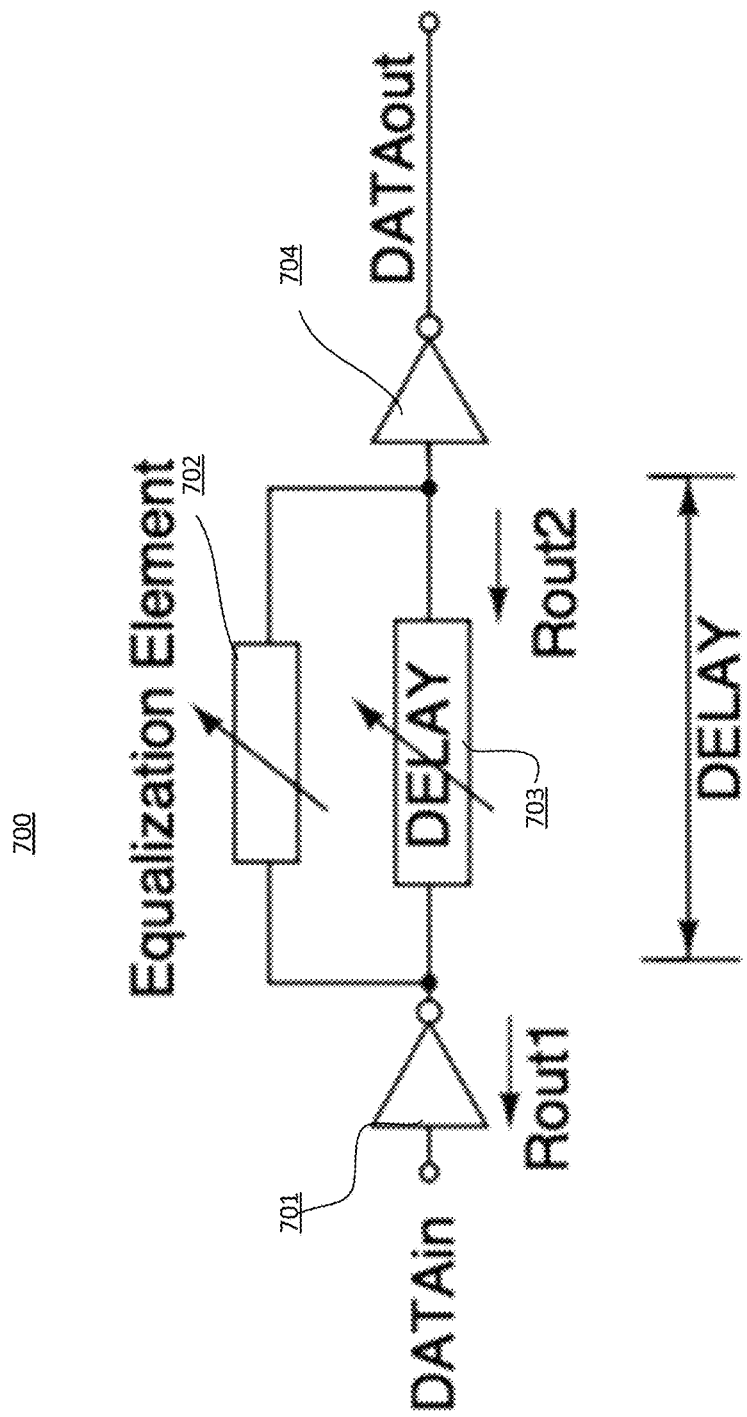
FIG. 7 is a simplified diagram illustrating an input buffer module according to embodiments of the present invention.

FIG. 7 is a simplified diagram illustrating an input buffer module according to embodiments of the present invention. This diagram is merely an example, which should not unduly limit the scope of the claims. One of ordinary skill in the art would recognize many variations, alternatives, and modifications. FIG. 7 shows a generalized block diagram of an input buffer module, which can be used as input buffer to a DAC (as shown in FIG. 6) or other types of communication devices and/or components. Input signal at DATAin is coupled to inverter 701. Output signal at DATAout goes out at inverter 704. Equalization element 702 and delay element 703 are configured in parallel. As explained above, equalization element 702 can be implemented using one or more resistors, and the resistance value of equalization element 702 is based on operating frequency and/or characteristics of the delay element 702. In various embodiments, delay module 703 includes an odd number of inverters, which provide a predetermined amount of delay. The resistance value of equalization element 702 depends on the sizes of the inverters at the delay element 703. Based on the implementation, resistors with fixed resistance values may be used to optimize equalization performance under certain operating parameters. In various embodiments, the equalization element 702 is implemented using one or more variable resistors (e.g., implemented with CMOS transistors). For example, depending on the operating frequency, the resistance value of equalization element 702 may be changed. In certain implementations, resistor may be too large to implement in to the input buffer module. For example, suitably sized resistors may be too large for 7 nm processes, and inverter and/or transistor may be used to implement the equalization element.

The number of inverters at the delay element 703 may depend on the implementation of equalization element 702. Equalization element 702, if implemented with resistor or transistor, would require an odd number of inverters at delay element 703 to have the polarity change. On the other hand, if equalization element 702 is implemented using an inverter, polarity change is not needed and the delay element 703 may have an even number of inverters.

In various embodiments, equalization element 702 comprises a tunable resistor that is coupled to a control signal. The control signal would change the resistor value based on the data sample rate and/or operating frequency, and the objective is to minimize and/or eliminate ISI. For example, by adjusting the resistance value of equalization element 702, the amount of delay can be adjusted, which in turn provides equalization for removing ISI.

Figure 8:
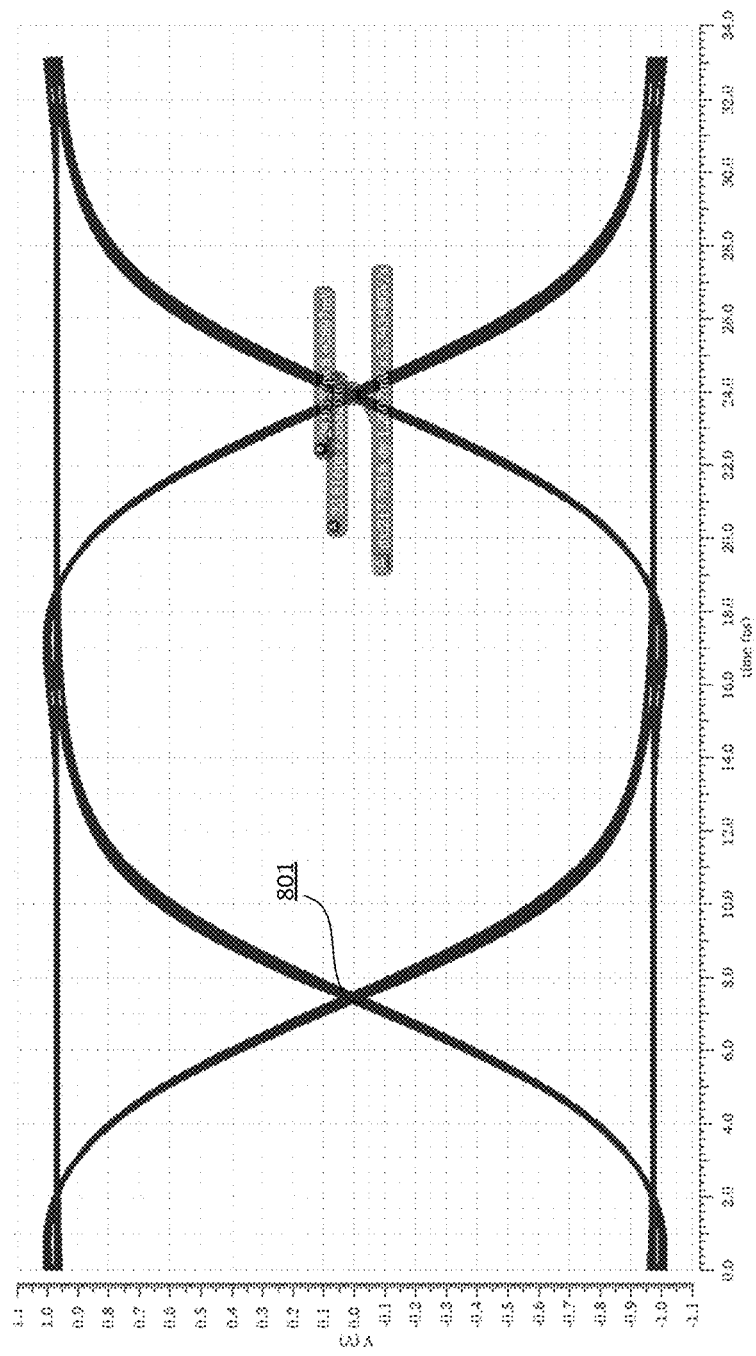
FIG. 8 is a graph illustrating ISI cancellation using equalization techniques according to embodiments of the present invention.

FIG. 8 is a graph illustrating ISI cancellation using equalization techniques according to embodiments of the present invention. This diagram is merely an example, which should not unduly limit the scope of the claims. One of ordinary skill in the art would recognize many variations, alternatives, and modifications. As can be seen at 801, ISI is virtually non-existent, wherein as there is much ISI presence shown in FIG. 3.

Figure 9:
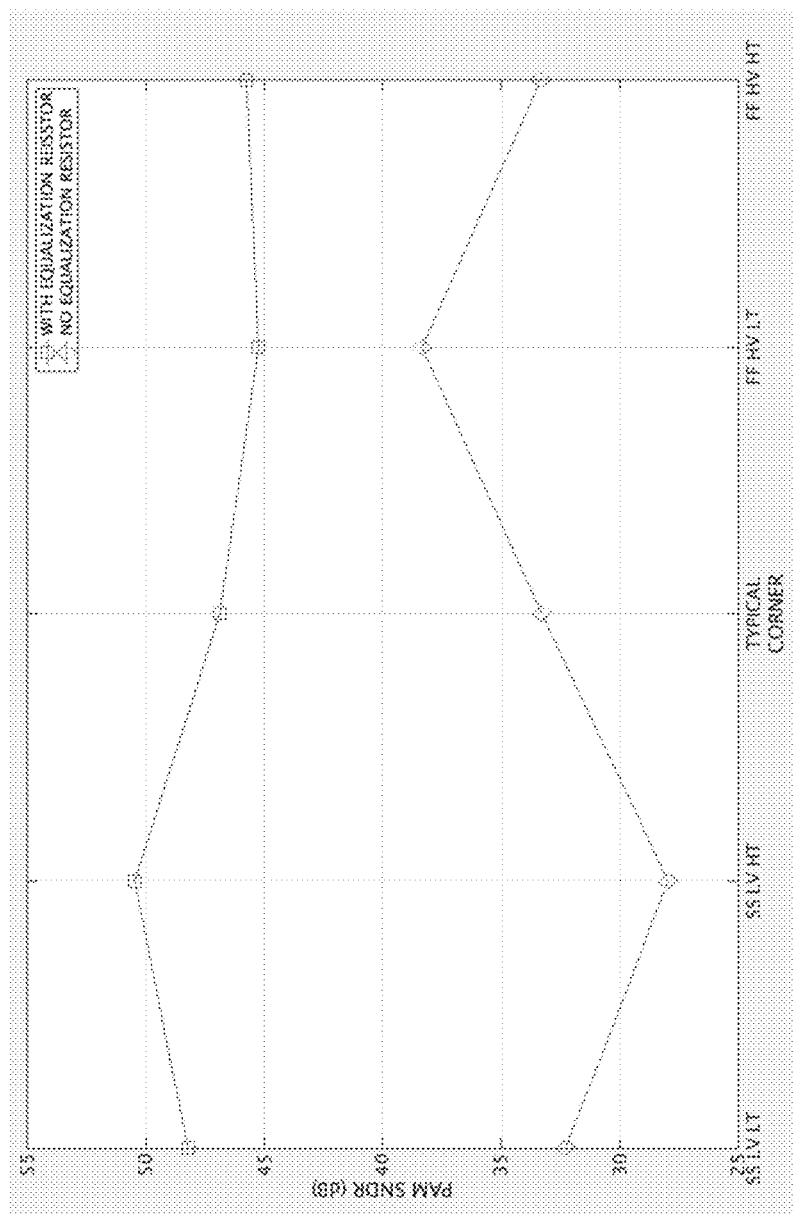
FIG. 9 is a graph illustrating performance of input buffer modules with equalization resistor according to embodiment of the present invention.

FIG. 9 is a graph illustrating performance of input buffer modules with equalization resistor according to embodiment of the present invention. This diagram is merely an example, which should not unduly limit the scope of the claims. One of ordinary skill in the art would recognize many variations, alternatives, and modifications. For the purpose of illustration, input buffer module (implemented using 16nm technology) are configured to operate at 60 Gbps. The plot shows that the data transmission performance of input buffer module with equalization resistor can be much better (over 15 dB gain as measured in SNDR) than the input buffer module without equalization. For example, certain pulse amplitude modulation (PAM) specification requires an SNDR of at least 31 dB. The input buffer module, without equalization, can drop below 30 in SNDR, which would not meet the requirement of PAM specification. It is to be appreciated that he extra margin afforded by equalization (e.g., over 50 dB at "SS LV HT") can be used to save power dissipation.

Figure 10:
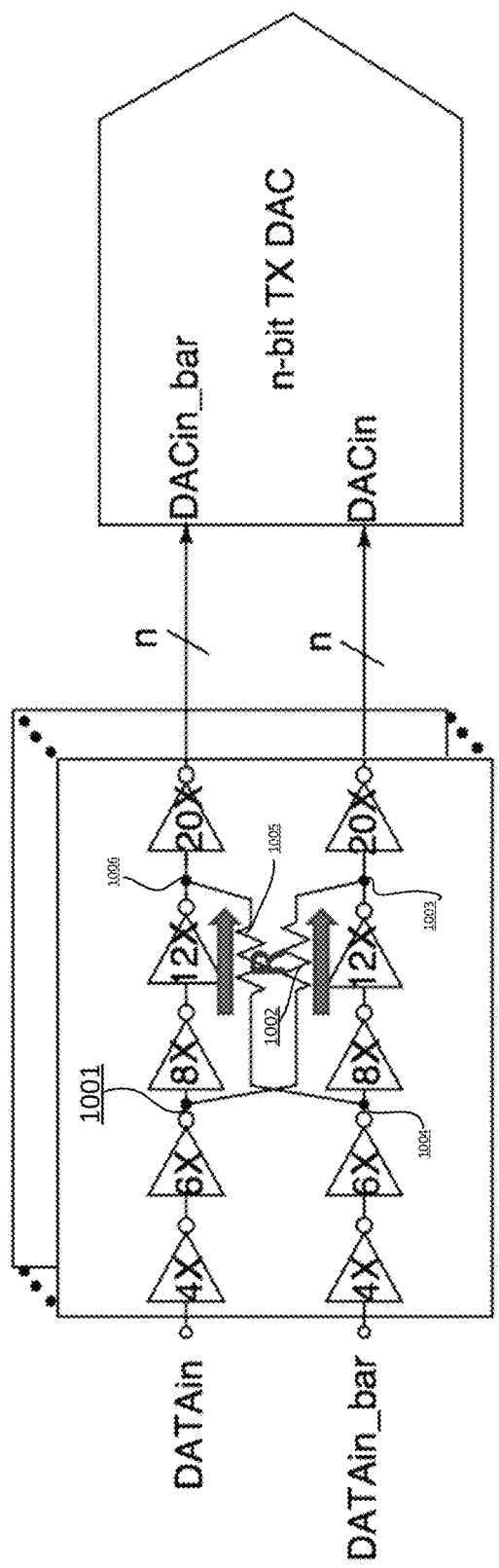
FIG. 10 is a simplified block diagram illustrating an input buffer module used for DAC applications according to embodiments of the present invention.

FIG. 10 is a simplified block diagram illustrating an input buffer module used for DAC applications according to embodiments of the present invention. This diagram is merely an example, which should not unduly limit the scope of the claims. One of ordinary skill in the art would recognize many variations, alternatives, and modifications. In FIG. 10, equalization resistors are cross-coupled to reduce the amount of delay (i.e., using two instead of three inverters for equalization). Equalization resistor 1002 is coupled to node 1001 and node 1003. Since node 1001 on the path of DATAin input and node 1003 is on the path of DATAin_bar input, the signal through resistor 1002 (originated from DATAin at node 1003) is in opposite polarity relative to DATAin_bar input after passing through two inverters, as DATAin and DATAin_bar inputs are in opposite polarity. Similarly, resistor 1005 is also cross-coupled. Through cross coupling configuration, an even number of inverters can be configured in parallel relative to the equalization elements (e.g., resistors), which can be useful in various types of implementations. It is to be appreciated that other arrangements are possible as well.

Figure 11A:
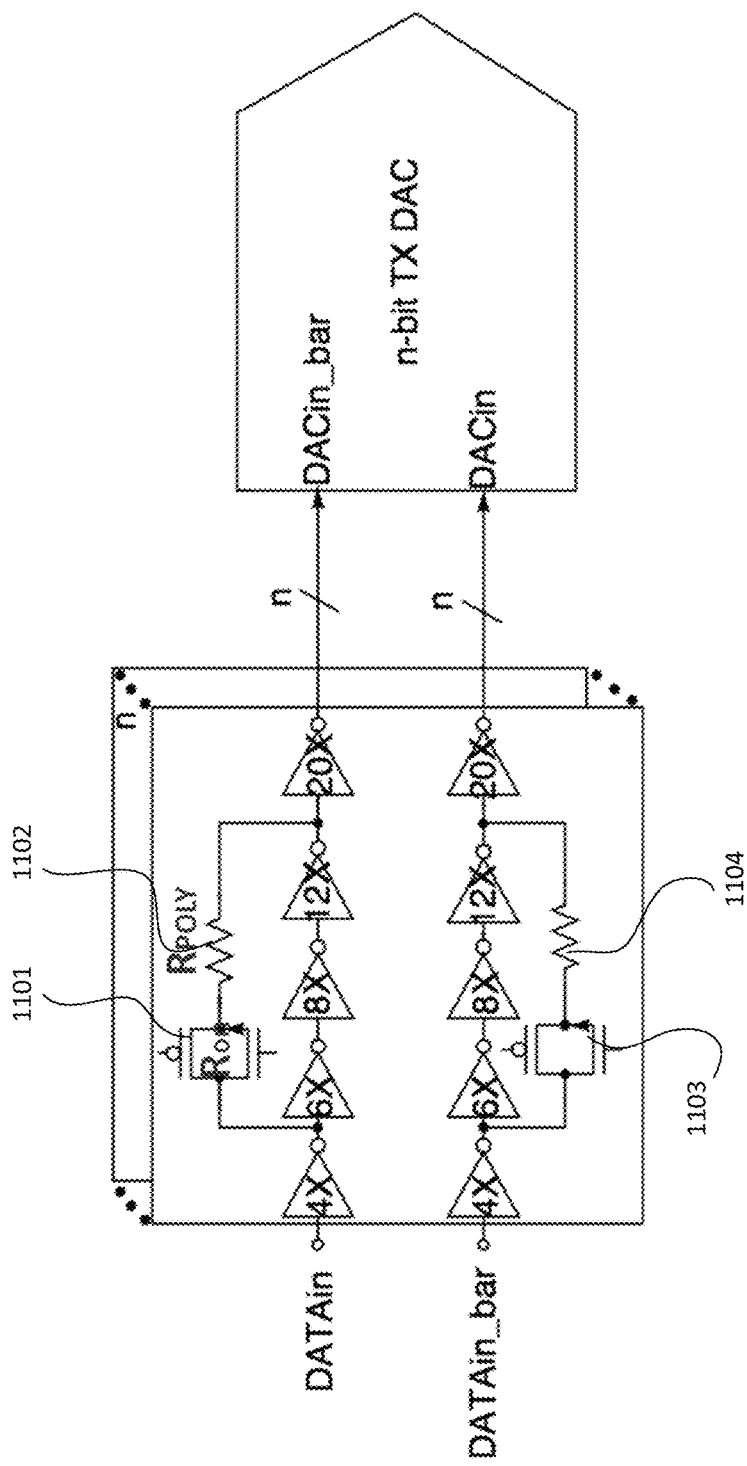
FIG. 11A is a simplified diagram illustrating an input buffer module implemented with switched equalization elements according to embodiments of the present invention.

It is to be appreciated that equalization elements can be implemented using various types of electrical components. FIG. 11A is a simplified diagram illustrating an input buffer module implemented with switched equalization elements according to embodiments of the present invention. This diagram is merely an example, which should not unduly limit the scope of the claims. One of ordinary skill in the art would recognize many variations, alternatives, and modifications. Resistor 1102 is coupled to switch 1101, and it is configured in parallel to three inverters on the "DATAin" data path as shown. Similarly, resistor 1104 is coupled to switch 1103, and it configured in parallel to three inverters on the "DATAin_bar" data path. For example, switches 1101 and 1103 can be implemented using transmission gates as shown, but it is to be understood that other types of switches can be used as well. For example, switches 1101 and 1103 are coupled to a control module (not shown), which sends control signal to enable or disable resistors 1102 and 1104.

For example, when there is no data transmission on the communication lanes (e.g., power down or loss of signal), resistor 1102 and resistor 1104 are disable to eliminate unnecessary power dissipation. It is to be noted that switch 1101 and switch 1103 are characterized by their own resistance values. And thus, the resistances of equalization elements are dictated by both $R_{OR}$ and $R_{Poly}$ (e.g., resistance of polysilicon based resistor). For example, the resistance value $R_{OR}$ of switch 1101 at the "on" state is used when determining the needed resistance value of resistor 1102.

Figure 11B:
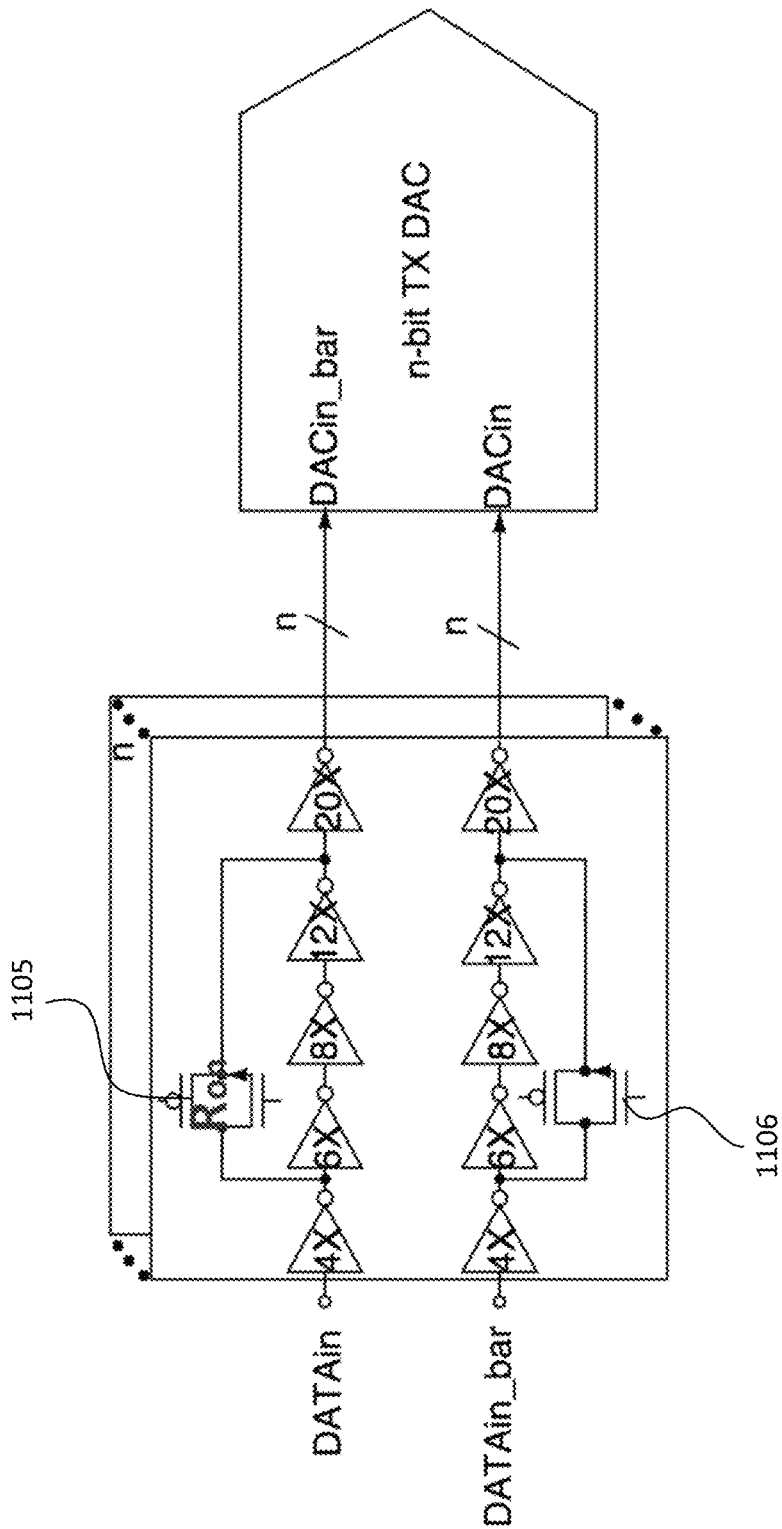
FIG. 11B is a simplified diagram illustrating an input buffer module implemented using switches as equalization elements according to embodiments of the present invention.

The required resistance value of the equalization element may be sufficiently small that the resistance of the switches would be sufficient. FIG. 11B is a simplified diagram illustrating an input buffer module implemented using switches as equalization elements according to embodiments of the present invention. This diagram is merely an example, which should not unduly limit the scope of the claims. One of ordinary skill in the art would recognize many variations, alternatives, and modifications. As shown in FIG. 11B, equalization elements are implemented using switch 1105 and switch 1106 as shown. For example, switch 1105 is implemented using a transmission gate, and it is configured in parallel relative to three inverters (i.e., 6X, 8X, 12X) on the "DATAin" signal path. The switch 1105 acts as both a switch and a resistor. For example, when there is no signal on the data path "DATAin", switch 1105 receives a control signal (e.g., from a control module) that turns switch 1105 off to save power. When switch 1105 is on, the resistance of switch 1105 (e.g., implemented using a transmission gate) is used for equalization. In various implementations, for devices manufactured using 7 nm processes, a resistor (e.g., a polysilicon implementation of resistor) may occupy too much area, and the resistance afforded by switch 1105 may suffice. Switch 1106 similar functions both as a switch and an equalization element.

Figure 12:
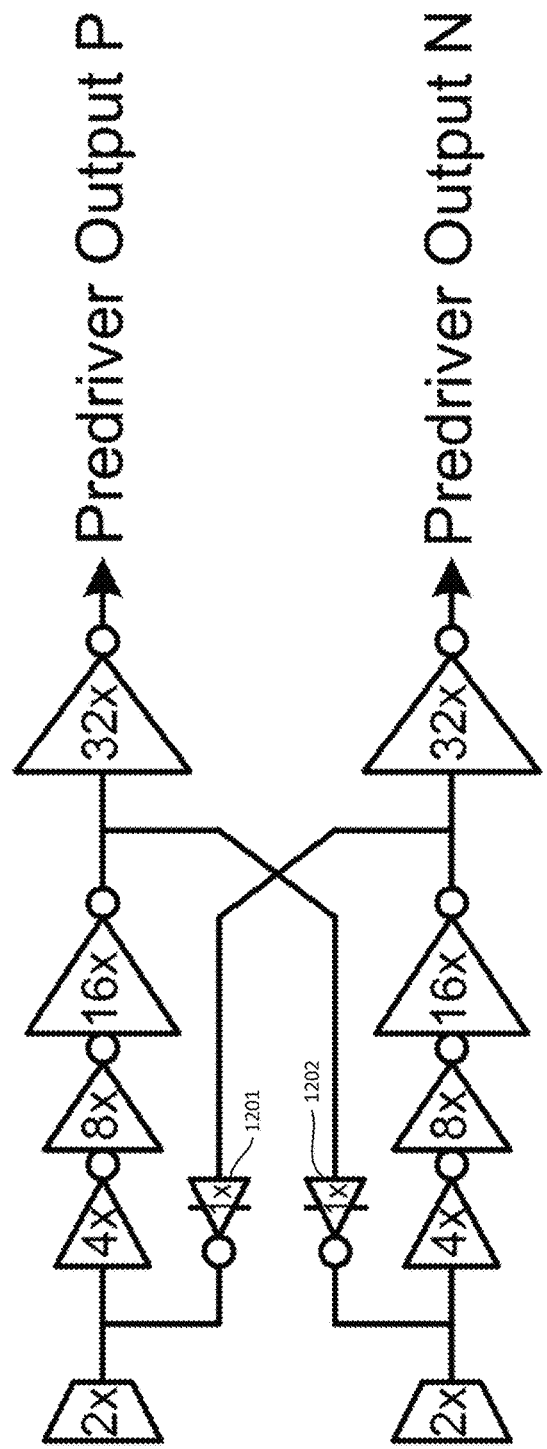
FIG. 12 is a simplified diagram illustrating an input buffer module with inverters as equalization elements according to embodiments of the present invention.

FIG. 12 is a simplified diagram illustrating an input buffer module with inverters as equalization elements according to embodiments of the present invention. This diagram is merely an example, which should not unduly limit the scope of the claims. One of ordinary skill in the art would recognize many variations, alternatives, and modifications. As explained above, resistors (e.g., polysilicon based resistors) may be too large for small devices (e.g., devices manufactured using 7 nm processes). In various embodiments, small inverters are used as resistors to provide equalization. Inverters 1201 and 1202 are configured to function as equalization elements with their outputs having opposite polarity from the data signals. Even small inverters can have large impedance values, and thus relative small inverters are used to function as resistors for equalization. As shown in FIG. 12, inverter 1201 is a small "1X" inverter that is configured in parallel to large inverters (e.g., 4X, 8X, and 16X) as shown.

Figure 13:
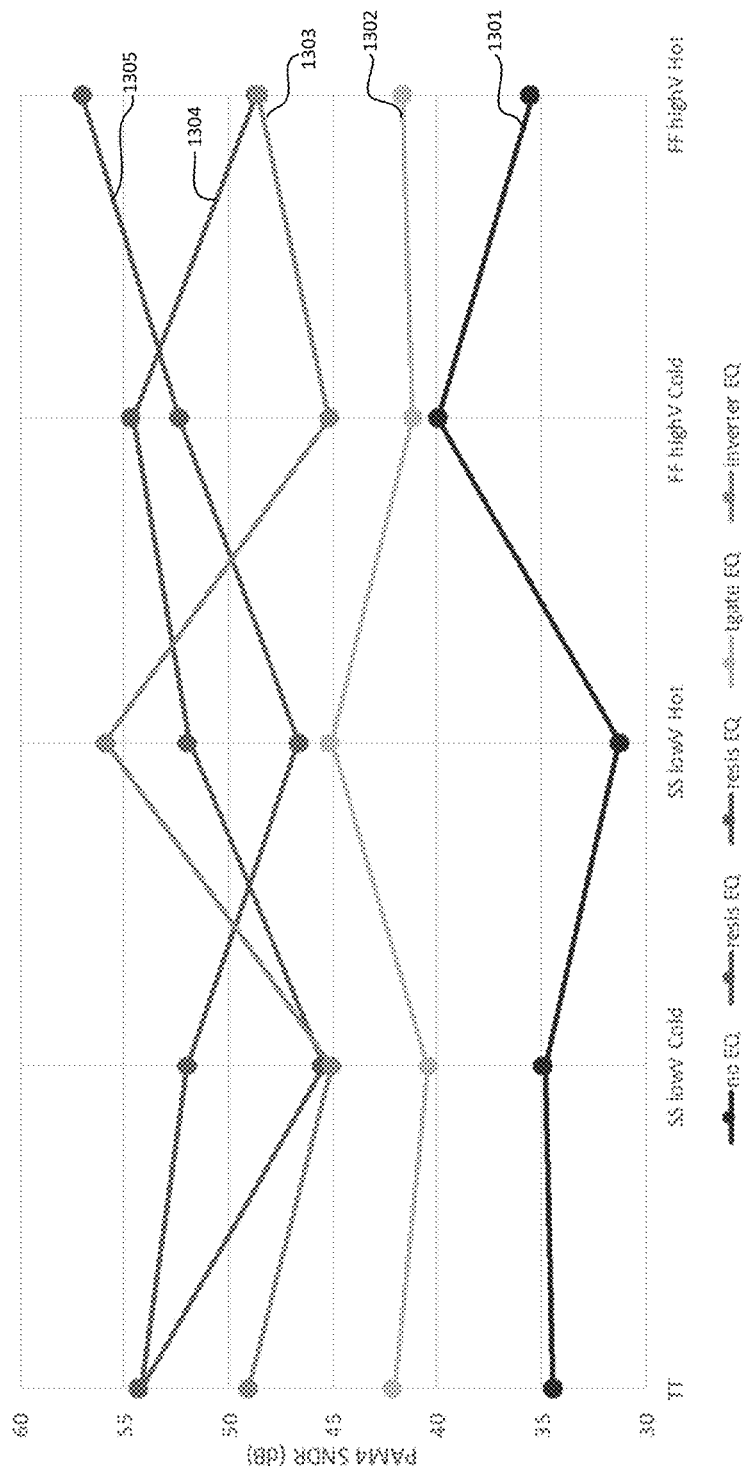
FIG. 13 is a graph illustrating performance improvement provided by equalization elements according to embodiments of the present invention.

FIG. 13 is a graph illustrating performance improvement provided by equalization elements according to embodiments of the present invention. For example, equalization elements are implemented in PAM4 communication systems with circuits manufactured using 7 nm processes. Curve 1301 shows SNDR (measured in dB) of an input buffer module without equalization elements. Curve 1302 shows SNDR of an input buffer module that uses a transmission gate for equalization (e.g., illustrated in FIG. 11B), which provides a sizable improvement (almost 15 dB gain at "SS lowV Hot"). Curve 1303 shows SNDR of an input buffer module that uses inverter for equalization (e.g., illustrated in FIG. 12), and it has a large improvement over curve 1301. Curve 1304 and curve 1305 show SNDRs of input buffer modules that use resistors (e.g., different resistor implementations) for equalization, which provides large performance gain over input buffer module without equalization.

Figure 14:
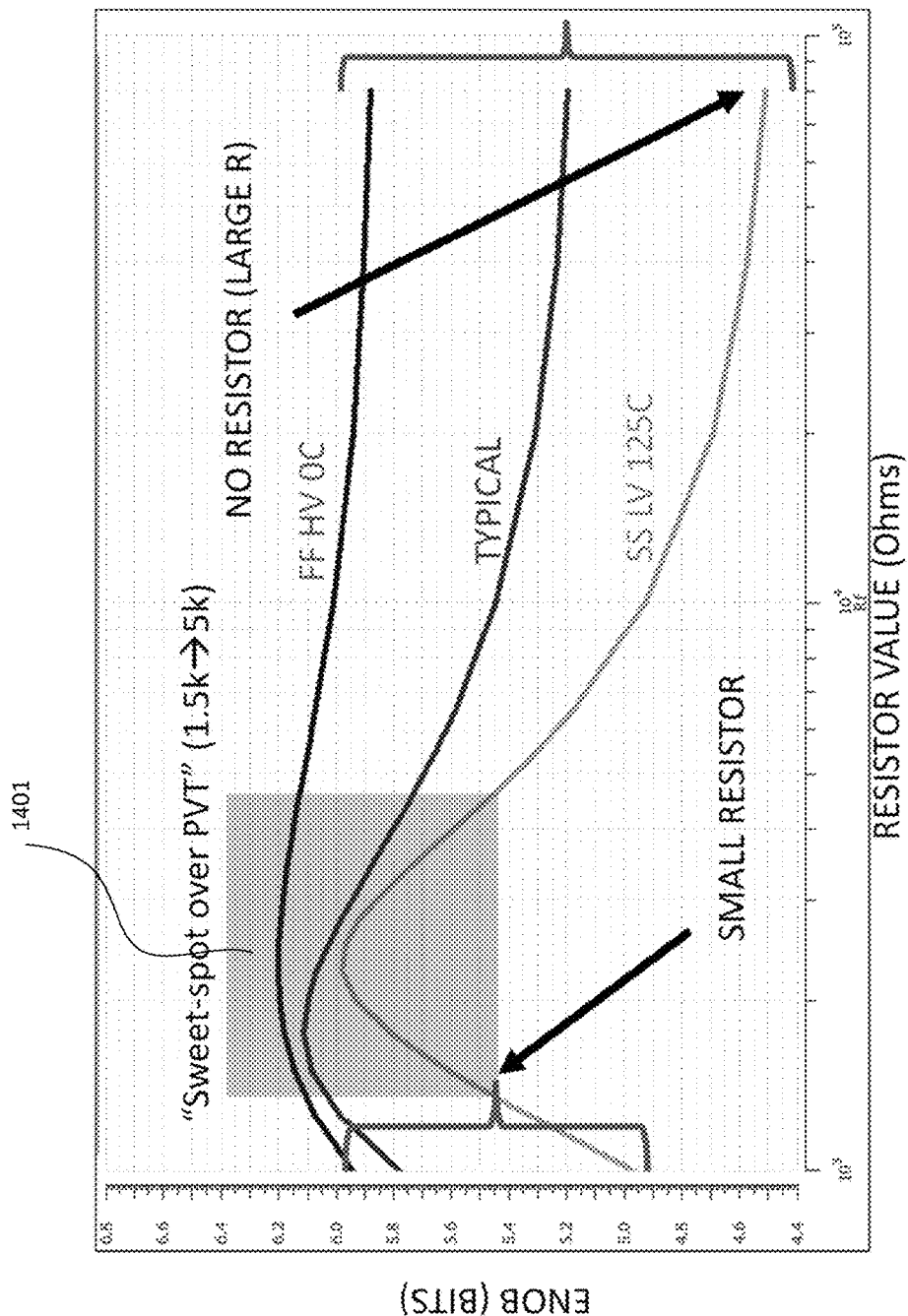
FIG. 14 is a graph illustrating effect of equalization element according to embodiments of the present invention.

FIG. 14 is a graph illustrating effect of equalization element according to embodiments of the present invention. This diagram is merely an example, which should not unduly limit the scope of the claims. One of ordinary skill in the art would recognize many variations, alternatives, and modifications. For example, the measurement of effective number of bits (ENOB) on the y-axis is associated with a 7-bit DAC operating at 60 GS/s (at an output frequency of about 27 GHz). As shown in FIG. 14, the shaded area 1401 is a sweet spot where ENOB measurements are highest, and the corresponding resistance values (in ohms) are shown. For this particular system, resistance value is around 2000 ohms. It is to be understood that depending on the specification implementation, optimal resistance value of the equalization element may vary. For example, optimal resistance value for equalization can be determined empirically and/or through calculation.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. An input buffer device comprising:
   a first input terminal;
   a first plurality of inverters comprising n inverters configured in series, n indicating a first quantity of inverters and being two or greater, the first plurality of inverters including a first inverter and a first group of m inverters, m indicating a second quantity of inverters, the first inverter being coupled to the first input terminal;
   a first equalization element being characterized by a predetermined resistance value, the predetermined resistance value being based on a delay associated with the first group of m inverters, the first equalization element being configured in series relative to the first group of m inverters;
   a first output terminal coupled to the first plurality of inverters;
   a second input terminal;
   a second plurality of inverters;
   a second output terminal coupled to the second plurality of inverters; and
   a second equalization element coupled to the second plurality of inverters.

2. The device of claim 1 wherein the first equalization element comprises a resistor.

3. The device of claim 1 wherein the first equalization element comprises a resistor and a switch.

4. The device of claim 3 wherein the switch disables the first equalization element if a control signal indicates no signals on the first input terminal.

5. The device of claim 1 wherein m is an odd integer.

6. The device of claim 1 wherein the first equalization element comprises an inverter.

7. The device of claim 1 wherein the resistance value is between 500 ohms and 5000 ohms.

8. The device of claim 1 wherein the first input terminal and the second input terminal receive differential input signals.

9. A digital-to-analog converter (DAC) system comprising:
- a DAC device being configured to convert n bits of input data, n indicating a number of bits;
- a first input buffer module comprising a first plurality of inverters and a first equalization element, the first input buffer module being configured to provide a first input signal to the DAC device;
- a second input buffer module comprising a second plurality of inverters and a second equalization element, the second input buffer module being configured to provide a second input signal to the DAC device;
- wherein:
  - the first input signal and the second input signal form a pair of differential inputs signals;
  - the first plurality of inverters includes a first a segment of m inverters, m indicating a quantity of inverters, the first segment of m inverters being associated with a first delay value; and
  - the first equalization element is characterized by a first predetermined resistance value, the first predetermined resistance value being determined based on the first delay value.

10. The system of claim 9 further comprising n input buffer modules, each of the n input buffer modules corresponding to one of the n bits of input data.

11. The system of claim 10 wherein each of the n input buffer modules provides a pair of differential input signals.

12. The system of claim 9 wherein the m is an odd integer.

13. The system of claim 9 wherein the first equalization element comprises a resistor.

14. The system of claim 9 wherein the first equalization element comprises a transmission gate and a resistor.

15. The system of claim 9 wherein:
- the second plurality of inverters includes a second a segment of m inverters, the second segment of m inverters being associated with a second delay value; and
  - the second equalization element is characterized by a second predetermined resistance value, the second predetermined resistance value being determined based on the second delay value.

16. A data input buffer device comprising:
- a first input terminal;
- a first plurality of inverters comprising n inverters configured in series, n indicating a first quantity of inverters and being two or greater, the first plurality of inverters including a first inverter and a first group of m inverters, m indicating a second quantity of inverters, the first inverter being coupled to the first input terminal;
- a first output terminal coupled to the first plurality of inverters;
- a second input terminal;
- a second plurality of inverters comprising n inverters configured in series, the second plurality of inverters including a second inverter and a second group of m inverters, the second inverter being coupled to the second input terminal;
- a first equalization element being characterized by a first predetermined resistance value, the first predetermined resistance value being based on a delay associated with the second group of m inverters, the first equalization element being configured in series relative to the second group of m inverters;
- a second equalization element being characterized by a second predetermined resistance value, the first predetermined resistance value being based on a delay associated with the first group of m inverters, the second equalization element being configured in series relative to the first group of m inverters; and
- a second output terminal coupled to the second plurality of inverters.

17. The device of claim 16 wherein m is an even integer.

18. The device of claim 16 wherein the first equalization element comprises a resistor and a transmission gate.

19. The device of claim 16 wherein the first equalization element comprises an equalization inverter, the equalization inverter being characterized by a resistance value of less than 10,000 ohms.

20. The device of claim 16 wherein the data input buffer device is characterized by an operating frequency of at least 10 Gbps.

* * * * *